United States Patent [19]

Neidorff et al.

[11] Patent Number: 5,214,322

[45] Date of Patent: May 25, 1993

[54] HIGH VOLTAGE CMOS POWER DRIVER

[75] Inventors: Robert A. Neidorff, Bedford, N.H.; James A. McKenzie, Cary, N.C.

[73] Assignee: Unitrode Corporation, Billerica, Mass.

[21] Appl. No.: 730,358

[22] Filed: Jul. 15, 1991

[51] Int. Cl.⁵ .................. H03K 5/12; H03K 17/687
[52] U.S. Cl. .................. 307/585; 307/263; 307/571
[58] Field of Search .......... 307/263, 443, 491, 571, 307/572, 584, 585, 579, 300

[56] References Cited

U.S. PATENT DOCUMENTS

| | | | |
|---|---|---|---|
| 4,707,623 | 11/1987 | Bismarck | 307/585 |
| 4,956,569 | 9/1990 | Olivo et al. | 307/443 |
| 4,963,774 | 10/1990 | Masuda | 307/443 |
| 5,019,724 | 5/1991 | McClure | 307/443 |
| 5,057,711 | 10/1991 | Lee et al. | 307/443 |

Primary Examiner—Jin F. Ng
Assistant Examiner—Sinh Tran
Attorney, Agent, or Firm—Weingarten, Schurgin, Gagnebin & Hayes

[57] ABSTRACT

A low-voltage CMOS switching controller which utilizes PMOS and nMOS devices to control the switching of a high voltage power supply. Two pMOS devices are used as switches to control the high voltage level on an output terminal and an nMOS device is used to switch the output terminal to ground once the high voltage has been reduced to a safe level. The controller also includes circuitry which prevents both pMOS devices from being on at the same time, thereby shunting the high voltage supply to ground.

11 Claims, 4 Drawing Sheets

HIGH VOLTAGE CMOS POWER DRIVER

BACKGROUND OF THE INVENTION

A MOS device 10, shown in FIG. 1, includes a moderately doped substrate 12 into which two regions 14, 16, called the source and drain, respectively, are diffused. The source 14 and drain 16 are heavily doped with a carrier opposite from that with which the substrate 12 is doped. Adjacent the substrate 12 and between the source 14 and drain 16 is an oxide insulating layer 20. Adjacent the insulating layer 20 is a polycrystaline silicon electrode called a gate 18.

When a potential is applied between the source 14 and drain 16, no current flows unless a potential is also applied between the gate 18 and the substrate terminal 30, which is typically electrically connected to the source 14. As a voltage is applied between the gate 18 and the substrate terminal 30 (and source 14), a region, called a channel 22, is formed which permits conduction between the source 14 and drain 16. This region becomes conductive because the electric field 32 induced in the substrate 12 attracts charged carriers into the channel 22. The amount of conduction is a function of the voltage applied between the gate 18 and the substrate terminal 30 and the voltage applied between the gate 18 and the source 14. Hence, the applied gate voltage may be used to switch the device between conducting and non-conducting states.

The polarity of the carriers, the polarity of the gate potential 28 (which is defined relative to the source 14), and the direction of the electric field 32 depend upon which dopants are used in the substrate 12, the source 14 and the drain 16. If the substrate 12 is p-carrier (hole) doped, then the source 14 and the drain 16 are n-carrier (electron) doped and the device is termed an nMOS device. This device permits current flow when a positive voltage, relative to the source 14 and drain 16, is applied to the gate 18. The electric field vector 32 points away from the gate 18 and electrons move toward the gate-substrate interface forming an n-channel 22. If the substrate 12 is n-carrier (electron) doped, the source 14 and the drain 16 are p-carrier (hole) doped and the device is termed a pMOS device. This device permits current flow when a negative voltage, relative to the source 14 and drain 16, is applied to the gate 18. The electric field vector 32 points toward the gate 18 and holes move toward the gate-substrate interface forming a p-channel 22.

When a low-voltage nMOS high density process device is used to switch a high voltage applied between the source 14 and drain 16, several problems occur, one of which is that the high electric field between the source 14 and the drain 16 may accelerate electrons to such a high energy as to cause the creation of additional electron-hole pairs upon the collision of the energetic electron with the lattice structure of the substrate 12. This process, called impact ionization, affects nMOS devices to a greater degree than pMOS devices because the effective mass of the electrons is less than the effective mass of positively charged carriers. Therefore, the electrons in n-channel devices reach a higher velocity than do holes in p-channel devices. The charged particles move in random directions and may cause further damage to the device by trapping charge in the oxide layer thereby permanently altering the electric field in the vicinity of the channel 22. This damage is similar to that which occurs in the device upon exposure to ionizing radiation.

To avoid these problems, high voltage MOS fabrication techniques may be used in constructing the device. These high voltage MOS fabrication techniques, such as making the oxide layer 20 thicker and increasing the impurity concentration grading in the source 14 and drain 16 region to reduce the electric field density, requires the MOS devices to be larger thereby reducing the device density on a chip.

The present invention permits high density low-voltage MOS devices to be used to switch high voltages without sacrificing device density.

SUMMARY OF THE INVENTION

The invention relates to a low-voltage CMOS switching controller which utilizes pMOS and nMOS devices to control the switching of a high voltage power supply. Two pMOS devices are used as switches to control the high voltage level on an output terminal and an nMOS device is used to switch the output voltage completely to ground once the output voltage has been reduced to a safe level. The controller also includes circuitry which prevents both pMOS devices from being on at the same time, thereby shunting the high voltage supply to ground. The controller further includes circuitry which prevents the pMOS device in communication between the output terminal and the high voltage source from being on at the same time as the nMOS device.

BRIEF DESCRIPTION OF THE DRAWINGS

Other features and benefits of the invention can be more clearly understood with reference to the specification and the accompanying drawings in which.

ILLUSTRATIVE EMBODIMENTS

Figure 1:
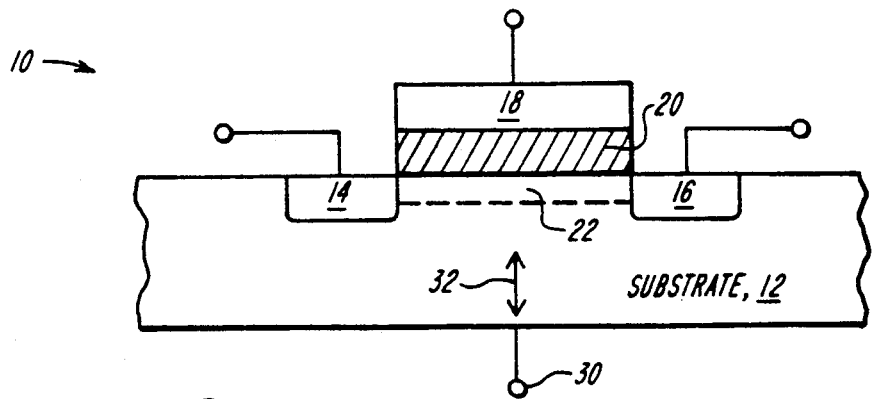
FIG. 1 is a cross-sectional view of a MOS device known to the prior art.
Figure 2:
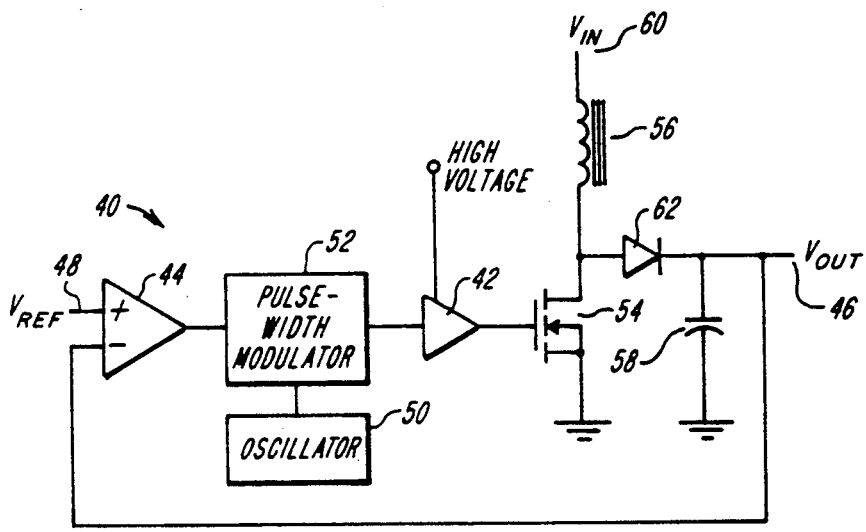
FIG. 2 is an embodiment of a dc to dc high voltage converter in which the invention may be used.

An example of a dc to dc converter 40 which uses the high voltage controller 42 of the invention is depicted in FIG. 2. In this dc to dc converter 40, a comparator 44 compares the voltage at the output 46 of the converter 40 with a reference voltage 48 and generates an error signal representative of the difference between the output and reference voltages. An oscillator 50 and pulse-width modulator 52 generate a pulse train whose duty cycle is a function of the error signal. This pulse train is the input signal to the controller 42. The output signal of the high voltage controller 42, which is a function of the pulse train, switches a power switch 54. The switching of the power switch 54 controls current flow between a voltage source 60 and ground. This switching is done in such a way that at various times an inductor 56 and a capacitor 58 are alternately charging and discharging thereby generating a dc voltage at the output 46 which is greater than the supply voltage 60. A diode 62 maintains the current flow in one direction.

Figure 3:
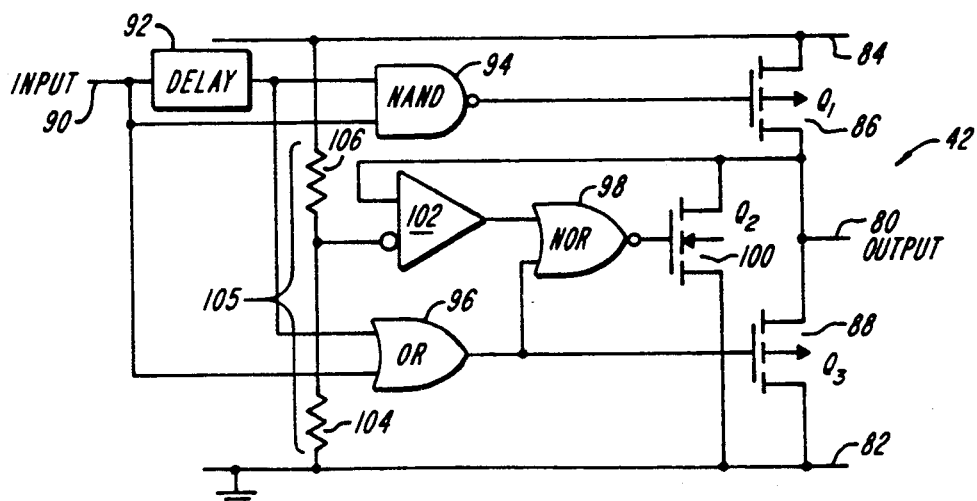
FIG. 3 is a schematic diagram of an embodiment of the invention.

An embodiment of a low-voltage CMOS high voltage switching controller is shown in FIG. 3. In the embodiment shown, a controller output 80, which is used to drive the power switch 54 (FIG. 2), is switched between ground 82 and a high voltage 84 by the switching action of three CMOS transistors Q1 86, Q2 100 and Q3 88. When transistor Q1 86 is conducting and transistors Q2 100 and Q3 88 are off, the voltage at the output 80 is high relative to ground 82. When transistor Q1 86 switches off and Q3 88 is switched on, the voltage at the output 80 decays toward ground. In this way, by switching transistors Q1 86 and Q3 88 alternately on and off, the voltage at the signal output 80 can be made to switch repeatedly from a high voltage level to a low voltage level and back. The two CMOS transistors Q1 86 and Q3 88 which switch the high voltage are pMOS transistors which have a higher tolerance to damage from switching high voltage than do nMOS transistors.

However by their nature, pMOS transistors are not capable of switching the voltage of the output 80 to ground 82. Instead, if just the pMOS transistor Q3 88 were between the output 80 and ground 82, upon the switching-on of the pMOS transistor Q3 88, the voltage at the output 80 would slowly decay; asymptotically approaching a value of about 2 volts. Therefore, an nMOS transistor Q2 100 is also placed between the output 80 and ground 82 to switch the voltage at the output 80 to ground 82 once the voltage at the output 80 has decayed to a low enough value, due to the switching of the pMOS transistor Q3 88, to be safely switched by the nMOS transistor Q2 100.

The remainder of the circuitry of the controller 42 is best explained in terms of its operation. Assume that the present state of the controller 42 is such that the output 80 of the controller is low. Therefore, transistor Q1 86 is off and transistor Q3 88 is on. An input signal 90 to the controller 42 causes the controller 42 to switch output states from low to high. This input signal to the controller 42 is a common input signal to a delay circuit 92, a NAND gate 94 and an OR gate 96. The second input signal to the NAND gate 94 and the OR gate 96 is the output signal from the delay circuit 92. When the input signal 90 goes high so as to change the state of the output 80 of the controller 42 to high, the output of the OR gate 96 immediately goes high. This happens independent of the state of the other input to the OR gate 96 and results in the switching off of transistor Q3 88; since Q3 88 is a pMOS device. At some time later, the input to the OR gate 96 from the output of the delay circuit 92 also goes high, but this has no effect on the state of the OR gate 96.

The output of the OR gate 96, which is high is also the input to a NOR gate 98 whose output goes low upon the switching of the OR gate 96 regardless of the state of the other input to the NOR gate 98. This results immediately in the shutting off of transistor Q2 100; since Q2 100 is an nMOS device. At the same time, the input signal 90 causes one input of the NAND gate 94 to go high, but the output of the NAND gate 94 does not go low until the second input to the NAND gate 94 goes high some time later, due to the delay resulting from the delay circuit 92. Once the second input of the NAND gate 94 goes high, the output goes low, switching on transistor Q1 86; since Q1 86 is a pMOS device. The delay circuit 92 guarantees that transistor Q1 86 will not turn on before transistor Q3 88 turns off. This ensures that transistors Q1 86 and Q3 88 will not short the high voltage 84 to ground 82 upon switching.

When the input 90 to the controller 42 goes low, the low signal on the input of the NAND gate 94 immediately causes the output to go high, regardless of the state of the other input to the NAND gate 94, shutting off transistor Q1 86. At some time later the second input to the NAND gate 94 goes low, delayed by the delay circuit 92, but the output of the NAND gate 94 remains unchanged. Simultaneously, the input to the OR gate 96 goes low and at some time later, again due to the delay caused by the delay circuit 92, the second input to the OR gate 96 goes low forcing the output of the OR gate 96 to go low and turning on transistor Q3 88.

Once transistor Q3 88 turns on, the voltage at the output 80 begins to drop. The voltage at the output 80 is one input to a comparator 102. The voltage at other input to the comparator 102 is determined by a voltage divider 105 constructed of resistors 104,106, which are connected between the high voltage 84 and ground 82. The output of the comparator 102 goes low once the voltage on the output 80 of the controller 42 decays to the value of the voltage determined by the voltage divider 105.

The voltage at which the output of the comparator 102 switches is chosen to be low enough so that transistor Q2 100 can switch the voltage between the output 80 and ground 82 without damage. When this voltage is reached, the transistor Q2 100 switches on, grounding the output 80 and bringing the voltage level of the output 80 to zero. In this way, transistor Q2 100, the nMOS device which is voltage sensitive, switches on only when the voltage at the output 80 is at a low enough level to be safely switched.

Figure 4:
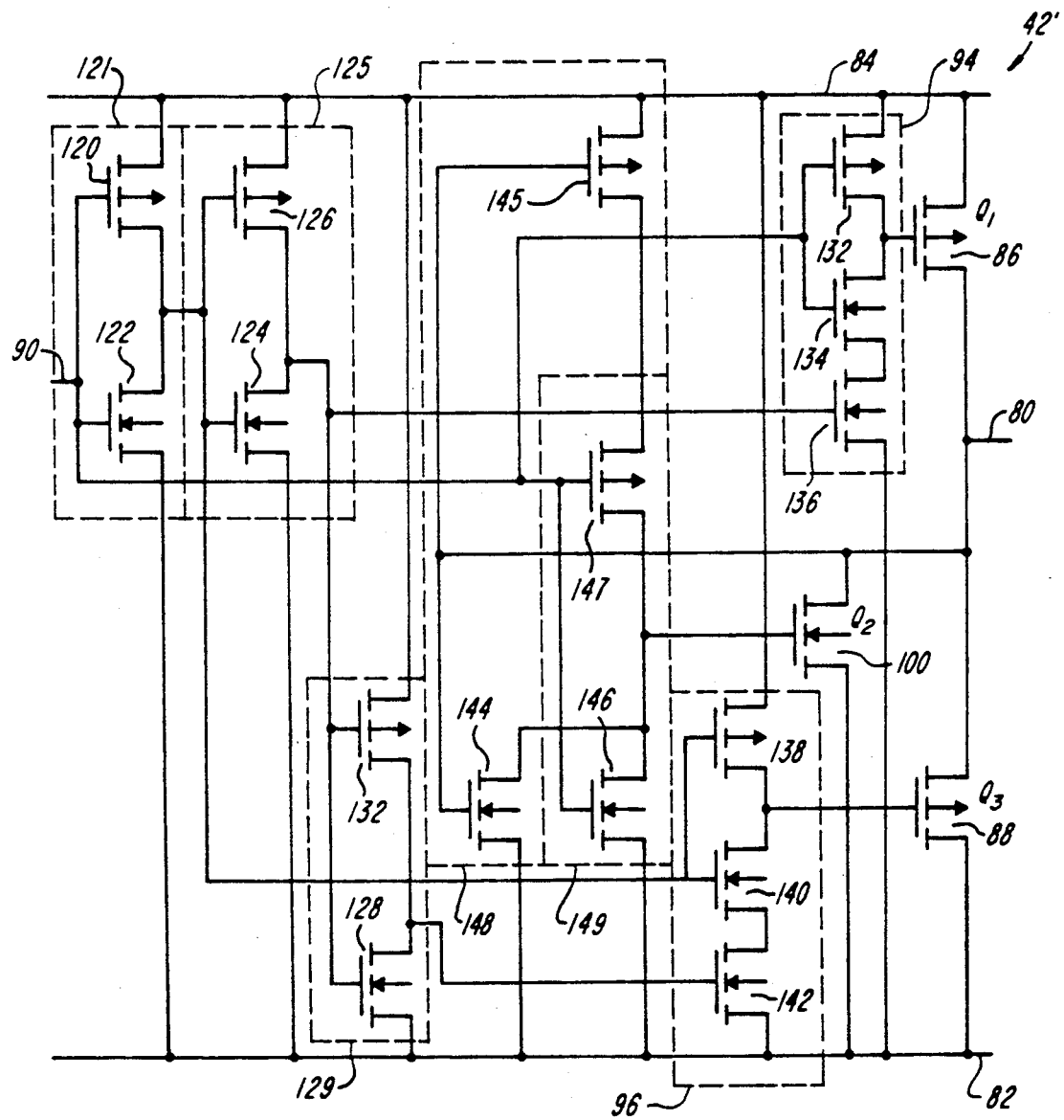
FIG. 4 is a transistor-level diagram of another embodiment of the invention.

Another embodiment which functions similarly to the above-described controller but which is constructed entirely of MOS devices is shown in FIG. 4. In this embodiment, pairs of transistors 120-122, 124-126, and 128-130, are configured as a series of inverters 121, 125, and 129, respectively. Pairs of inverters 121-125, or 125-129 in series form the equivalent of the delay circuit 92 by each contributing a switching delay. The input signal 90 enters the delay circuitry by way of inverter 121. The output of the inverter pair 121-125 provides an input to a NAND gate 94 configured from transistors 132, 134, and 136. As in the previous embodiment, the other input to the NAND gate 94 is the input 90 to the controller 42' and the output of the NAND gate 94 switches transistor Q1 86.

Inverter pair 125-129 provides an equivalent delay to the Q2 100 and Q3 88 portions of the controller 42'. As in the previous embodiment, the delayed output of the inverter pair 125-129 is one input to the OR gate 96 constructed from transistors 138, 140, and 142 and the output of the OR gate 96 switches transistor Q3 88. The non-delayed input signal is supplied to the OR gate 96 from the output of the single inverter 121.

Transistor Q2 100 is switched by a group of transistors 144, 145, 146 and 147 which together function as a combined voltage divider-comparator-NOR gate (FIG. 3, 102,105,98 respectively). Specifically, the combination 148 of transistors 144 and 145 behave as the equivalent of a combined comparator and voltage divider, because the size of the transistors 144, 145 determine at what voltage the combination 148 switches. Similarly, the combination 149 of transistors 146 and 147 along with the comparator behave as an OR gate. With this embodiment the functionality of the previous embodiment is duplicated using only discrete MOS devices.

Figure 5:
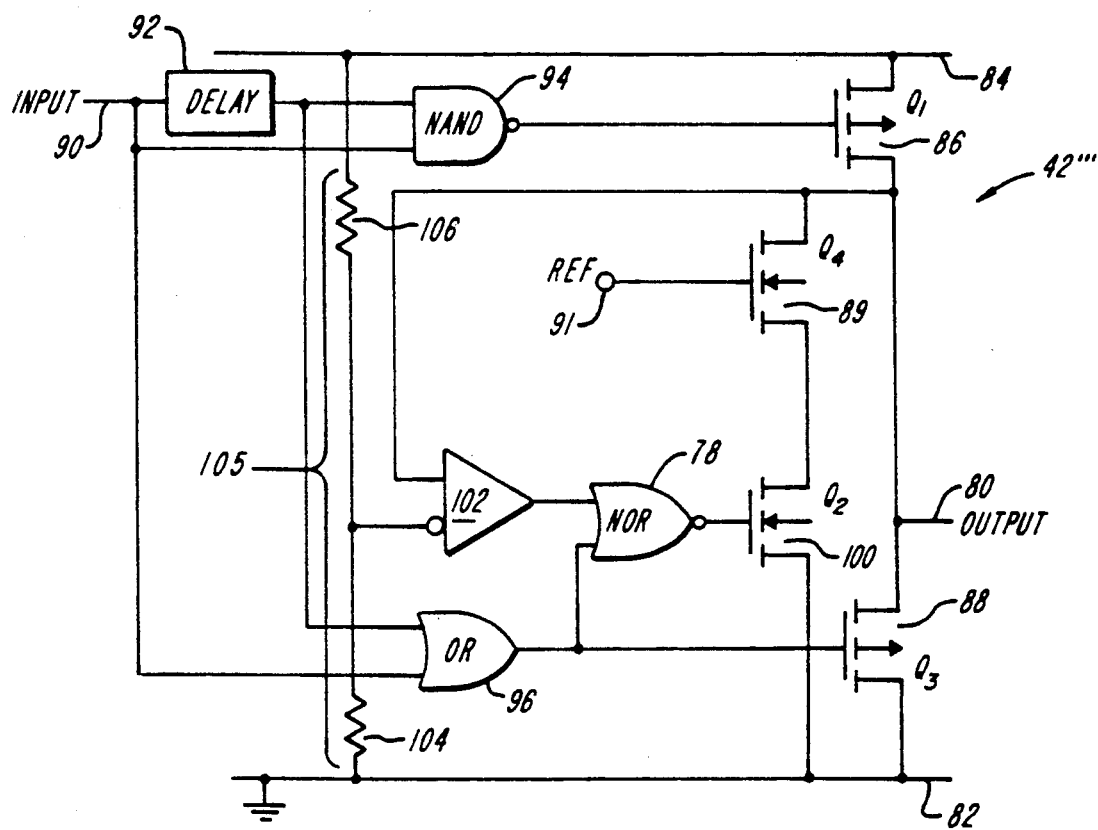
FIG. 5 is a schematic diagram of a third embodiment of the invention.

A third embodiment which functions similarly to the above-described controller but which includes a second nMOS device in a cascode configuration with the first nMOS device is shown in FIG. 5. In this embodiment, the two nMOS devices Q2 100 and Q4 89 act as a voltage divider with the output voltage being distributed across both devices. This embodiment operates similarly to the embodiments previously described, except that once device Q2 100 switches on, as a result of the output voltage 80 dropping to a safe level, the voltage on the source of nMOS device Q4 89, which is connected to the drain of nMOS device Q2 100, begins to fall. When the voltage on the source of nMOS device Q4 89 decreases below the reference voltage 91 applied to its gate, the nMOS device 89 also turns on, shunting the output voltage 80 to ground 82. In this way, the voltage across nMOS device Q2 100 is always less than it would be if nMOS device Q4 89 was not present, thereby also preventing damage to the nMOS device Q2 100. However, since the second nMOS device Q4 89 acts as an additional resistor in series with the first nMOS device Q2 100, the decay time of the output voltage is increased. To decrease the decay time it is possible to decrease the inherent resistances of the nMOS devices Q2 100, Q4 89 by increasing their physical size.

Figure 6:
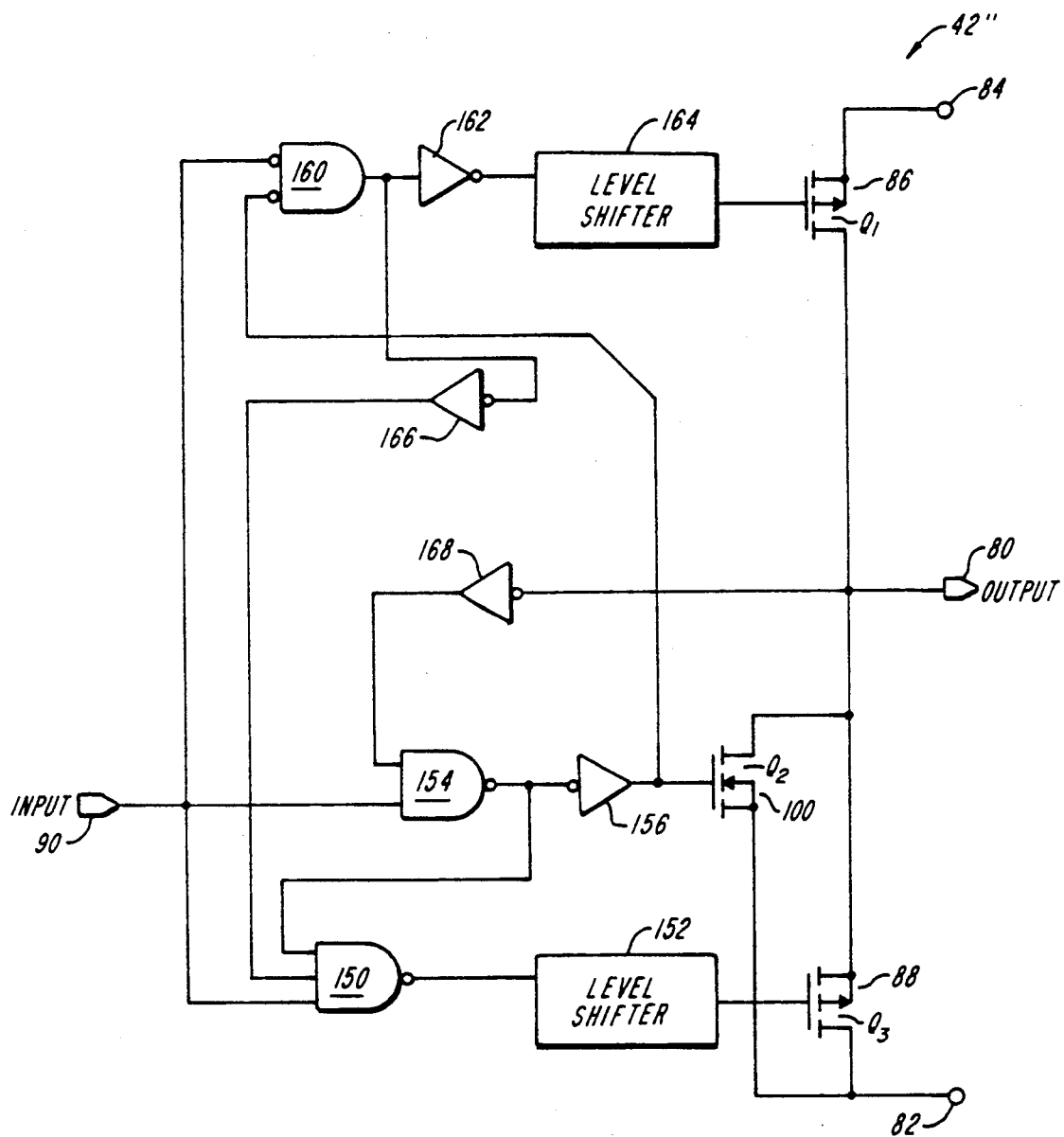
FIG. 6 is a schematic diagram of a fourth embodiment of the invention.

Yet another embodiment of the controller 42" of the invention is shown in FIG. 6. First considering the input signal 90 to the controller 42", which is one input to a NAND gate 150, to be low, the resulting output signal from the NAND gate 150 is high, regardless of the value of the signals on the other two input terminals of the NAND gate 150. The output of the NAND gate 150 is the input to a non-inverting level shifter 152, which drives the gate of the pMOS transistor Q3 high, turning it off. Simultaneously, the input signal 90 is applied to one input terminal of a second NAND gate 154 forcing the output of the NAND gate 154 to go high regardless of the value of the signal on its other input. This NAND gate output signal is inverted by the inverter 156, driving the gate of the nMOS transistor Q2 100 low; turning it off.

The input signal 90 is also one input to a NOR gate 160 whose other input is the output signal from the inverter 156. The two input signals to the NOR gate 160 being low, result in the output signal of the NOR gate 160 being high. It is this requirement that both the input signals to the NOR gate 160 be low which eliminates the cross-conduction between Q1 86 and Q2 when the output 80 is switched from low to high. This output signal is inverted by inverter 162 to a low value prior to its being an input signal to a second non-inverting level shifter 164. The resulting low output signal from the second non-inverting level shifter 164 causes the gate of PMOS transistor Q1 86 to go low, turning it on and bringing the output terminal 80 of the controller 42" to the level of the high voltage line 84.

When the input signal 90 to the controller 42" next goes high, the presence of a high input signal on the input of the NOR gate 160 causes the output of NOR gate 160 to go low, regardless of the value of the signal on the other input to the NOR gate 160. This NOR gate output signal is inverted to high by inverter 162 and level shifted by non-inverting level shifter 164. The presence of the shifted high signal on the gate of the pMOS transistor Q1 86 causes it to turn off.

The output signal 80 of the controller 42", which is high at the time the input signal 90 to the controller 42" goes high, is an input to inverter 168 resulting in an output signal which is low. The low output signal from the inverter 168 is one input to the NAND gate 154 forcing its output signal to go high regardless of the signal on its other input terminal. This output signal is subsequently inverted by inverter 156. The resulting low signal does not change the state of the transistor Q2 100, which remains off.

The output of the NOR gate 160, which is low, is inverted by inverter 166 to high and is one input signal to the NAND gate 150. The input signal 90, which is also high, is also an input signal to the NAND gate 150, as is the high output signal from NAND gate 154. The presence of the three signals, which are high, at the input terminals of the NAND gate 150 causes the output of the NAND gate 150 to go low. Requiring the three input signals to the NAND gate 150 to go low before switching Q3 88 to ground 82 prevents cross-conduction between Q1 86 and Q3 88 when switching the output 80 from high to low. This signal is level shifted by non-inverting level shifter 152 and applied to the gate of transistor Q3 88; turning it on.

The turning on of transistor Q3 88 connects the controller output 80 to ground 82 causing the voltage at the controller output 80 to fall. When the signal at the output 80, which is the input to the inverter 168, falls, the output of the inverter 168 goes high. The presence of the two signals, which are high, at the input terminals of NAND gate 154 causes its output signal to go low. This output signal is inverted by inverter 156 and applied to the gate of transistor Q2 100; turning it on.

The low signal from the NAND gate 154 is applied to an input terminal of the NAND gate 150, causing its output to go high regardless of the value of the other input signals. This low signal is level shifted by non-inverting level shifter 152 and applied to the gate of transistor Q3 88, turning it off. In this way, transistor Q3 is on for only a short time. That is, it is on just long enough to connect the controller output terminal 80 to ground 82 initially and to cause the output voltage to drop. Once the voltage at the controller output 80 falls to a low enough level, the nMOS transistor Q2 100 is turned on, grounding the output 80 of the controller 42". Thus, the pMOS transistor Q3 88 initially switches the voltage until the voltage level is low enough to be ground by the nMOS transistor Q2 100.

Other embodiments are possible which fall within the scope of the appended claims and it is the intent to be limited only by the scope of the claims.

What is claimed is:

1. A method of switching a voltage of an output of a controller from a high voltage value to a low voltage value using low-voltage CMOS transistors comprising the steps of:
   switching said voltage at said output of the controller from a high voltage value to a low voltage value using at least one pMOS transistor;
   comparing the voltage at said output of said controller to a predetermined low voltage reference value; and
   switching the output of the controller to ground using an nMOS transistor once the voltage at the output of the controller has decreased to said predetermined low voltage reference value.

2. A controller for switching a high voltage comprising:
   a controller output terminal;
   a high voltage source;

an electrical ground;

a first pMOS transistor electrically coupled between the high voltage source and the controller output terminal;

a second pMOS transistor electrically coupled between the controller output terminal and the electrical ground;

a first pMOS transistor electrically coupled between the controller output terminal and the electrical ground; and control circuitry electrically coupled to said first pMos transistor and said second pMos transistor for preventing said first pMOS 2 and said second pMOS transistor from being on simultaneously and further electrically coupled to said first nMos transistor for switching on the first nMOS transistor to thereby electrically coupled said controller output terminal to electrical ground only after the second pMOS transistor has been switched on and decreased the voltage at the controller output terminal to a safe level.

3. The controller of claim 2 further comprising a controller input terminal electrically coupled to said control circuitry, said control circuitry switching said first pMOS transistor, said second pMOS transistor and said first nMOS transistor in response to input signals applied to said controller input terminal.

4. The controller of claim 3 wherein said control circuitry comprises a delay circuit whose input is electrically coupled with said controller input terminal and whose output is electrically coupled with said first pMOS transistor and said second pMOS transistor, said delay circuit preventing the switching on of said first pMOS transistor until said second pMOS transistor has switched off.

5. The controller of claim 4 wherein said control circuitry further comprises a first comparator having a first comparator first input terminal, a first comparator second input terminal and a first comparator output terminal, said first comparator first input terminal electrically coupled with a reference voltage source providing a reference voltage, said first comparator second input terminal electrically coupled with said controller output terminal and said first comparator output terminal electrically coupled with said first nMOS transistor, said first comparator preventing said first nMOS transistor to switch on unless the voltage at said controller output terminal is not greater than said reference voltage.

6. The controller of claim 5 wherein said voltage reference source comprises a voltage divider electrically coupled between said high voltage source and said electrical ground.

7. The controller of claim 5 further comprising a NOR gate having a NOR gate first input terminal, a NOR gate second input terminal and a NOR gate output terminal, said NOR gate output terminal electrically coupled with said first nMOS transistor, said NOR gate second input terminal electrically coupled with said delay circuit and said NOR gate first input terminal electrically coupled with said first comparator output terminal, sad NOR gate preventing the switching on of said first nMOS transistor unless said second pMOS transistor is on.

8. The controller of claim 2 further comprising a second nMOS transistor electrically coupled between said first nMOS transistor and said controller output terminal in a cascode configuration, said second nMOS transistor having a gate connected to a reference voltage.

9. The controller of claim 3 wherein said second pMOS transistor is turned off after said first nMOS transistor is turned on.

10. The controller of claim 9 wherein said second pMOS transistor is turned off in response to the decreasing voltage at the controller output.

11. The controller of claim 4 wherein said delay circuitry comprises a plurality of MOS transistors connected so as to generate a total delay which is related to the switching delay of each MOS transistor.

* * * * *

UNITED STATES PATENT AND TRADEMARK OFFICE
CERTIFICATE OF CORRECTION

PATENT NO. : 5,214,322
DATED : May 25, 1993
INVENTOR(S) : Robert A. Neidorff et al.

It is certified that error appears in the above-indentified patent and that said Letters Patent is hereby corrected as shown below:

In the Abstract, line 2, "PMOS" should read --pMOS--.

Col. 5, line 55, "PMOS: should read --pMOS--

Column 7, line 8, "pMOS" should read --nMOS--.

Column 7, line 13, "pMOS 2" should read --pMOS transistor--

Signed and Sealed this

Third Day of May, 1994

Attest:

BRUCE LEHMAN

Attesting Officer    Commissioner of Patents and Trademarks